(12) United States Patent
Chou

(10) Patent No.: US 8,273,590 B2
(45) Date of Patent: Sep. 25, 2012

(54) METHODS FOR MANUFACTURING ARRAY SUBSTRATES

(75) Inventor: Cheng-Hsu Chou, Miao-Li County (TW)

(73) Assignee: Chimei Innolux Corporation (TW)

( * ) Notice: Subject to any disclaimer, the term of this patent is extended or adjusted under 35 U.S.C. 154(b) by 13 days.

(21) Appl. No.: 13/050,608

(22) Filed: Mar. 17, 2011

(65) Prior Publication Data
US 2012/0156834 A1 Jun. 21, 2012

(30) Foreign Application Priority Data
Dec. 16, 2010 (TW) .............................. 99144151 A

(51) Int. Cl.
*H01L 21/00* (2006.01)
(52) U.S. Cl. ................. 438/34; 257/59; 257/98; 438/23
(58) Field of Classification Search ................... 257/59, 257/98; 438/23, 34
See application file for complete search history.

(56) References Cited

U.S. PATENT DOCUMENTS
8,138,500 B2 * 3/2012 Hosoya ........................... 257/59
* cited by examiner

*Primary Examiner* — Asok Sarkar
(74) *Attorney, Agent, or Firm* — Lowe Hauptman Ham & Berner, LLP

(57) ABSTRACT

Disclosed is a patterned photoresist layer on a passivation layer, formed by a lithography process with a multi-tone photomask, having a non-photoresist region, a thin photoresist pattern, and a thick photoresist pattern. The passivation layer corresponding to the non-photoresist region is removed, thereby forming vias to expose a part of a drain electrode in a TFT and a part of a top electrode in a storage capacitor, respectively. The thin photoresist pattern is then ashed to expose the passivation layer in a pixel region. Thereafter, a conductive layer is selectively deposited on the exposed passivation layer and on the sidewalls/bottoms of the vias. Subsequently, the remaining thick photoresist pattern is ashed.

10 Claims, 8 Drawing Sheets

METHODS FOR MANUFACTURING ARRAY SUBSTRATES

CROSS REFERENCE TO RELATED APPLICATIONS

This Application claims priority of Taiwan Patent Application No. 099144151, filed on Dec. 16, 2010, the entirety of which is incorporated by reference herein.

BACKGROUND OF THE INVENTION

1. Field of the Invention

The present invention relates to a process of manufacturing a liquid crystal display, and in particular relates to a method of manufacturing an array substrate thereof.

2. Description of the Related Prior Arts

General processes of forming an array substrate in a liquid crystal display need four or five lithography steps, and four or five photomasks. A lithography step with only three photomasks utilizes a lift-off process, which firstly forms a photoresist layer as a sacrificing layer of a coating film. Thereafter, the coating film is deposited on regions covered and not covered by the photoresist layer, and the substrate is dipped in a stripper. The coating film on the photoresist layer can be stripped with the removal of the photoresist layer, thereby saving use of a photomask. However, the substrate containing the photoresist layers can not be implemented with general mass production equipment of thin film transistors for depositing. The stripped coating film easily adheres back of the substrate to form defects, or easily suspends in the stripper to obstruct stripper pipes.

Accordingly, a novel method replacing the conventional lift-off process without increasing photomasks is called for.

BRIEF SUMMARY OF THE INVENTION

One embodiment of the disclosure provides a method for manufacturing an array substrate, comprising: forming a thin film transistor, a pixel region, and a storage capacitor on a substrate, respectively; forming a passivation layer on the thin film transistor, the pixel region, and the storage capacitor; forming a first photoresist layer on the passivation layer; performing a lithography process by a first multi-tone photomask to pattern the first photoresist layer, thereby forming a first non-photoresist region, a first thin photoresist pattern, and a first thick photoresist pattern, wherein the first non-photoresist region substantially corresponds to a part of a drain electrode of the thin film transistor and a part of the storage capacitor, the first thin photoresist pattern substantially corresponds to the pixel region, and the first thick photoresist pattern substantially corresponds to the thin film transistor except for the part of the drain electrode; removing the passivation layer of the first non-photoresist region to expose the part of the drain electrode of the thin film transistor and the part of the storage capacitor; ashing the first thin photoresist pattern to expose the passivation layer of the pixel region; selectively depositing a conductive layer on the exposed part of the drain electrode of the thin film transistor, the exposed part of the storage capacitor, and the exposed part of the passivation layer; and removing the first thick photoresist pattern.

A detailed description is given in the following embodiments with reference to the accompanying drawings.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

The following description is of the best-contemplated mode of carrying out the invention. This description is made for the purpose of illustrating the general principles of the invention and should not be taken in a limiting sense. The scope of the invention is best determined by reference to the appended claims.

Figure 1A:
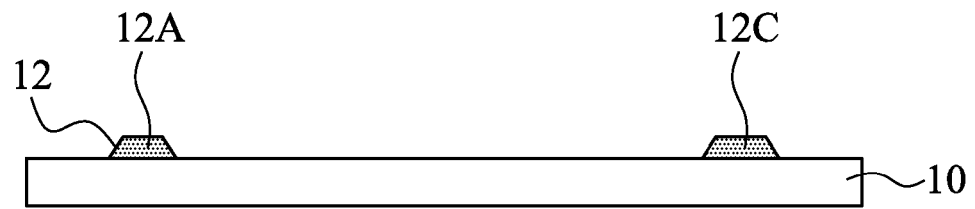
FIGS. 1A, 2A-2F, 3A-3B, and 4A-4D are cross-sectional views of a process of forming an array substrate in some embodiments of the disclosure.

As shown in FIG. 1A, a conductive pattern 12 is formed on a substrate 10. The substrate 10 can be a rigid inorganic material, e.g. transparent material such as glass, quartz, or the likes, or an opaque material such as wafer, ceramic, or the likes. The substrate 10 can be a flexible material, such as plastic, rubber, polyester, polycarbonate, or the likes. In some embodiments, the substrate 10 of the transparent material and thin film transistor products containing the same can be applied in transmissive liquid crystal displays, reflective liquid crystal displays, or self illumination displays. In other embodiments, the substrate 10 of the opaque material or poorly transparent material and thin film transistor products containing the same can be only applied in reflective liquid crystal displays or self illumination displays.

Figure 1B:
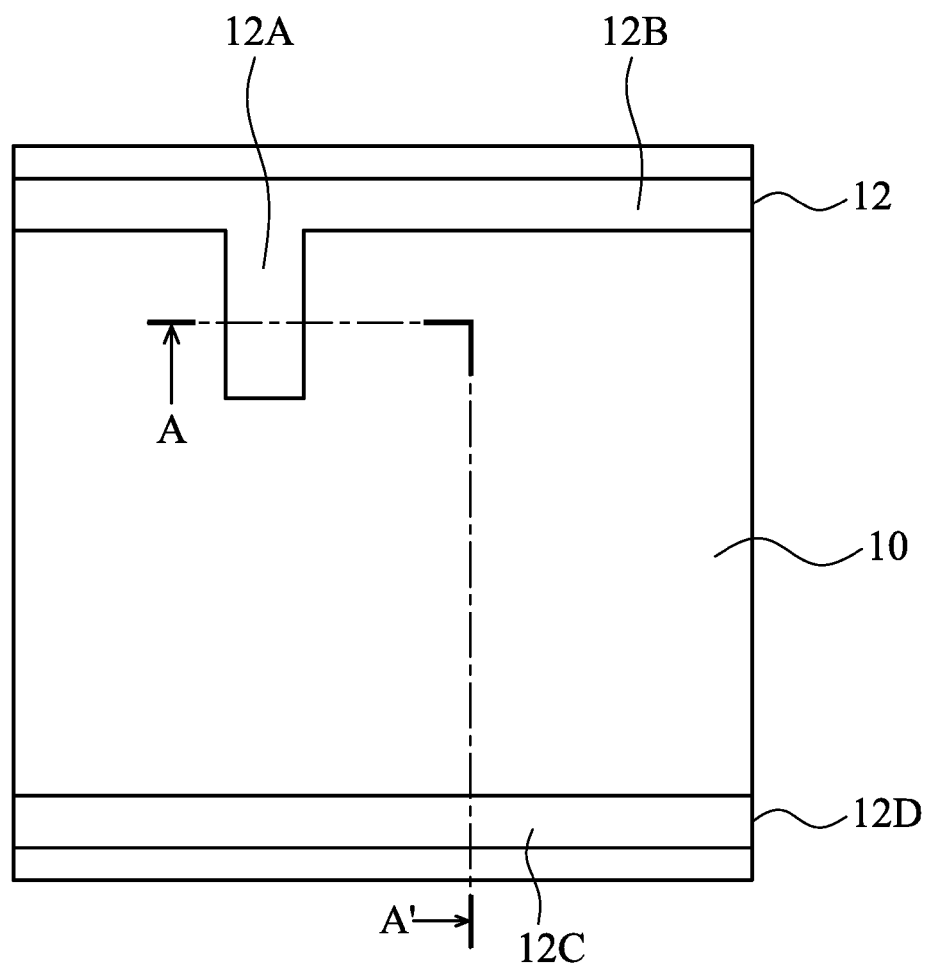
FIGS. 1B, 2G, 3C, and 4E are top-views of a process of forming an array substrate in some embodiments of the disclosure.

The conductive pattern 12 includes metal, alloy, or a multi-layered structure thereof. The conductive pattern 12 can be formed as below: a conductive layer is formed on the substrate 10, and then patterned by a lithography step and an etching step. The conductive layer can be formed by physical vapor deposition (PVD), sputtering, and the likes. The lithography step includes photoresist coating (e.g., spin-on coating), soft baking, photomask aligning, exposure, post-exposure baking, developing the photoresist, rinsing, drying (e.g., hard baking), and/or other suitable processes, and/or combinations thereof. The exposure step can be implemented or replaced by other proper methods such as maskless photolithography, electron-beam writing, or ion-beam writing. The etching step includes dry etching, wet etching, or combinations thereof. In some embodiments, the conductive pattern 12 includes molybdenum, aluminum, copper, titanium, gold, silver, alloys thereof, or single-layered or multi-layered structures thereof. Although in FIG. 1B, the conductive pattern 12 only serves as gate electrodes 12A of thin film transistors, gate lines 12B connected to the gate electrodes 12A, and common electrode lines 12D (a part of the common electrode lines 12D serves as bottom electrodes 12C of storage capacitors), the conductive pattern 12 may further serve as a contact pad or other elements if necessary. As shown in FIG. 1B, the gate electrode lines 12B and the common electrode lines 12D are parallel and alternately arranged to each other. It should be understood that a cross-sectional view of a cross-section line A-A' in FIG. 1B is shown in FIG. 1A.

Figure 2A:
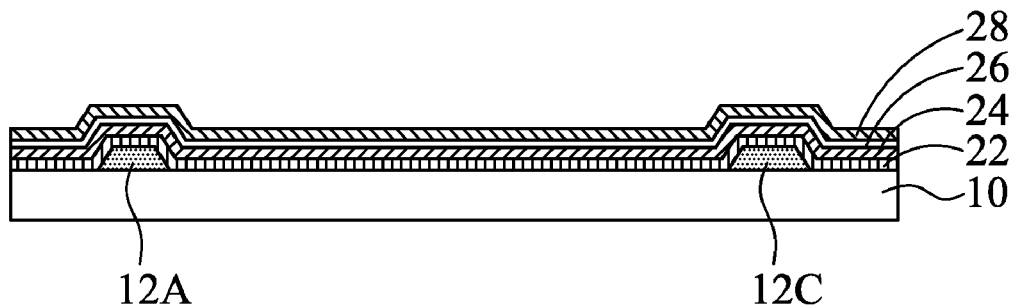

As shown in FIG. 2A, an insulation layer 22, a semiconductor layer 24, an ohmic contact layer 26, and a conductive layer 28 are then sequentially formed on the structure in FIG. 1A. The insulation layer 22 can be organic material such as organic silicon compound, or inorganic material such as silicon nitride, silicon oxide, silicon oxynitride, silicon carbide, or multi-layered structures thereof. The insulation layer 22 can be formed by chemical vapor deposition (CVD) such as plasma enhanced CVD (PECVD), low pressure CVD (LPCVD), sub atmosphere CVD (SACVD), or the likes. As shown in FIG. 2F and described later, the insulation layer 22 only serves as a gate insulation layer of the thin film transistor and a capacitor insulation layer of the storage capacitor. The insulation layer 22 can be other elements if necessary.

In one embodiment, the semiconductor layer 24 is composed of a general semiconductor material, e.g. amorphous silicon, polysilicon, micro crystallized silicon, single crystal silicon, or combinations thereof, and the semiconductor layer 24 can be formed by CVD, PECVD, rapid thermal CVD (RTCVD), ultra high vacuum CVD (UHVCVD), or molecular beam epitaxy (MBE). Alternatively, the semiconductor layer 24 is composed of an oxide semiconductor, e.g. zinc oxide, indium oxide, indium gallium zinc oxide, or tin oxide. In other embodiments, the oxide semiconductor material is a combination selected from at least two of zinc oxide, indium oxide, indium gallium zinc oxide, tin oxide, gallium oxide, aluminum oxide, and titanium oxide. The oxide semiconductor can be formed by a CVD process such as a PECVD, an LPCVD, or an SACVD process, or the likes. In general, the ohmic contact layer 26 includes doped silicon, such as an n-type dopant or a p-type dopant as required. The conductive layer 28 includes metal, alloy, or a multi-layered structure thereof, preferably a Mo/Al/Mo, a Mo/Cu, a Mo/Cu/Mo, or a Ti/Cu stack. The conductive layer 28 can be formed by evaporation or other PVD processes.

Figure 2B:
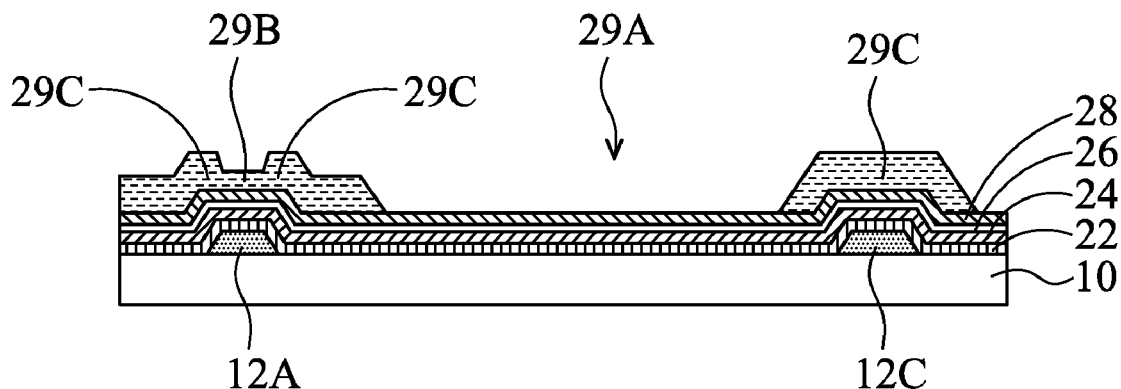

As shown in FIG. 2B, a patterned photoresist layer is formed on the conductive layer 28. The patterned photoresist layer is classified to three regions depending on their thicknesses: a non-photoresist region 29A, a thin photoresist pattern 29B, and a thick photoresist pattern 29C. The non-photoresist region 29A substantially corresponds to a predetermined pixel region, the thin photoresist pattern 29B substantially corresponds to a channel region of the thin film transistor, and the thick photoresist pattern 29C substantially corresponds to the storage capacitor and a source electrode and a drain electrode of the thin film transistor. The patterned photoresist layer can be composed of a positive photoresist or a negative photoresist. The patterned photoresist layer can be formed by photoresist coating (e.g., spin-on coating), soft baking, photomask aligning, exposure, post-exposure baking, developing the photoresist, rinsing, drying (e.g., hard baking), and/or other suitable processes, and/or combinations thereof. A multi-tone photomask such as a stack layer photomask or a grey level photomask is utilized to form the non-photoresist region 29A, the thin photoresist pattern 29B, and the thick photoresist pattern 29C with different thicknesses. It should be understood that the photomask has a transparent region corresponding to the non-photoresist region 29A, a semi-transparent region corresponding to the thin photoresist pattern 29B, and a light-shielding region corresponding to the thick photoresist pattern 29C, respectively, when the patterned photoresist layer is composed of a positive photoresist. Similarly, the photomask has a light-shielding region corresponding to the non-photoresist region 29A, a semi-transparent region corresponding to the thin photoresist pattern 29B, and a transparent region corresponding to the thick photoresist pattern 29C, respectively, when the patterned photoresist layer is composed of a negative photoresist. In short, the photomasks for the positive and negative photoresist layers have opposite patterns, respectively.

Figure 2C:
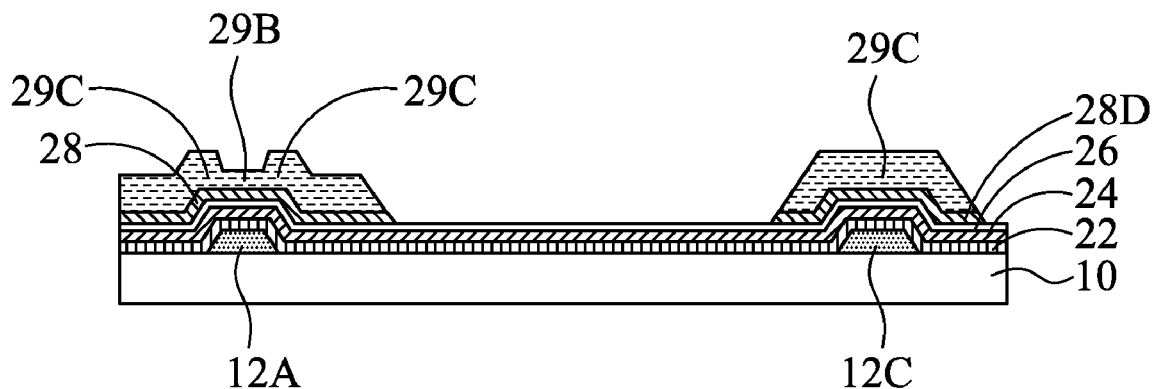

As shown in FIG. 2C, the conductive layer 28 of the non-photoresist region 29A is then removed to expose the ohmic contact layer 26. The removal of the conductive layer 28 can be by a dry etching or a wet etching process. If the conductive layer 28 is composed of aluminum or aluminum alloy, an aluminic acid can be adopted to wet etch the conductive layer 28 of the non-photoresist region 29A.

Figure 2D:
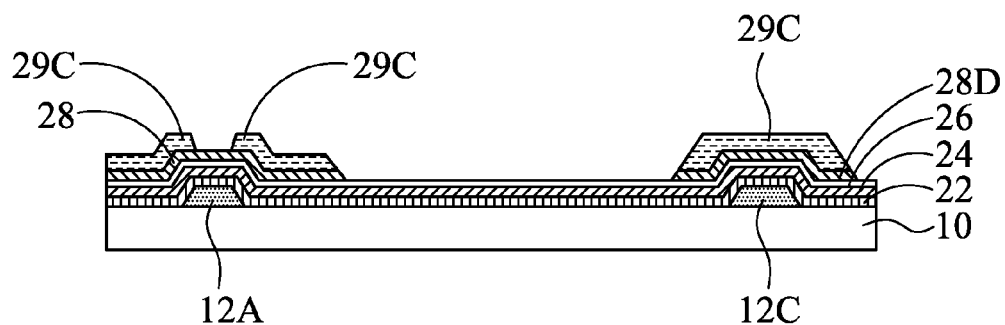

As shown in FIG. 2D, part of the patterned photoresist layer is ashed to expose the channel region of the thin film transistor. This ashing step can be performed by oxygen plasma at a temperature of room temperature to 200° C. An overly high ashing temperature may char the photoresist layer, which would make it difficult for removal in later processes. An overly low ashing temperature may slow down the ashing rate, and therefore increase its process period. The ashing step can totally remove the thin photoresist pattern 29B, and partially remove the thick photoresist pattern 29C. Because the ashing step is an isotropic removal process, the thick photoresist pattern 29C preferably has a larger profile (or area) than its corresponding region, e.g. the storage capacitor and the source electrode and the drain electrode of the thin film transistor. For example, when the thin photoresist pattern 29B has a thickness of 10 μm, the thick photoresist pattern 29C has a first profile edge, and the storage capacitor and the source electrode and the drain electrode of the thin film transistor has a second profile edge, and the first and second profile edges should have a distance of 10 μm. As such, the ashing step will not make the storage capacitor and the source electrode and the drain electrode of the thin film transistor shrink.

Figure 2E:
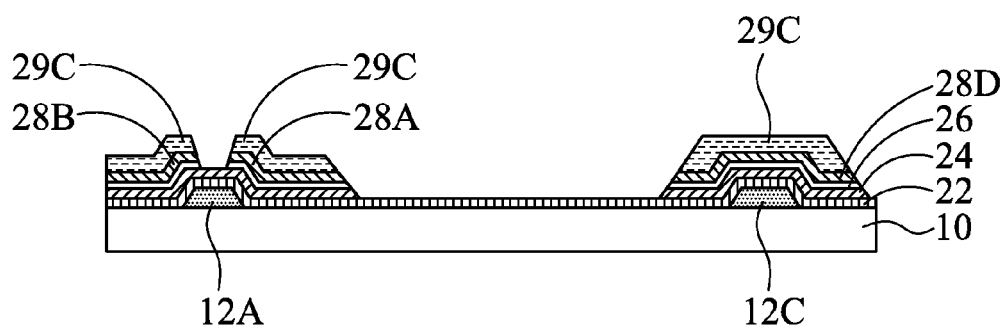
Figure 2F:
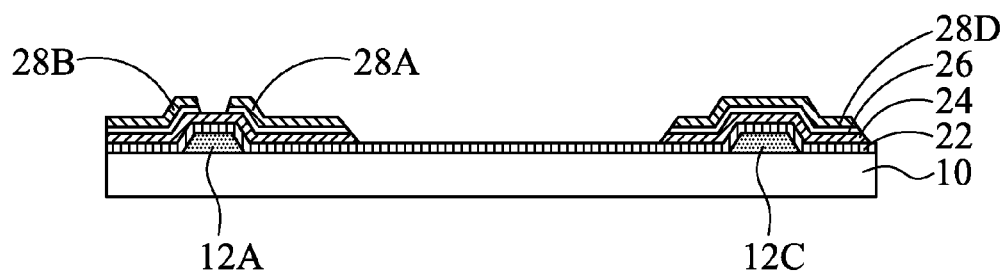

As shown in FIG. 2E, the conductive layer 28 and the ohmic contact layer 26 of the channel region in the thin film transistor, and the exposed ohmic contact layer 26 and the underlying semiconductor layer 24 of the pixel region are then removed. The removal can be by a dry etching or wet etching process.

Figure 2G:
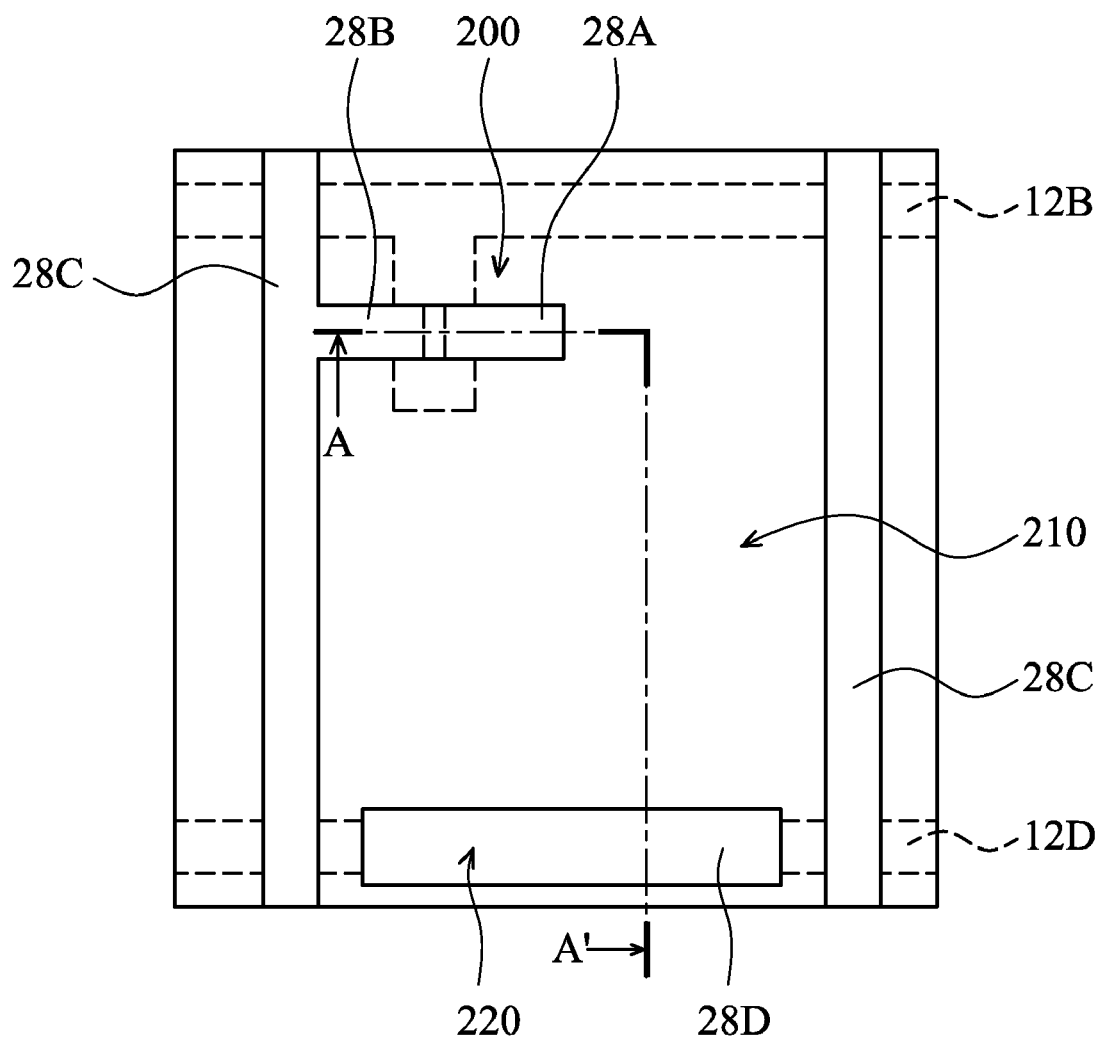

As shown in FIG. 2F, the remaining photoresist layer such as the thick photoresist pattern 29C is removed by the above mentioned ashing step or a conventional wet stripping step. Therefore, defining the thin film transistor 200, the pixel region 210, and the storage capacitor 220. It should be understood that a cross-sectional view of a cross-section line A-A' in FIG. 2G is shown in FIG. 2F. As shown in FIGS. 2F and 2G, one multi-tone photomask can be utilized to form the patterned photoresist layer, thereby patterning the conductive layer 28, the ohmic contact layer 26, and the semiconductor layer 24 to form the drain electrode 28A and the source electrode 28B of the thin film transistor 200, a data line 28C connected to the source electrode 28B, and a top electrode 28D of the storage capacitor 220. A region surrounded by the gate line 12B, another gate line (not shown), and the two data lines 23C is the pixel region 210. The storage capacitor 220 in the pixel region 210 includes the top electrode 28D, the bottom electrode 12C, and the insulation layer 22 served as a capacitor insulation layer therebetween, wherein the bottom electrode 12C is a part of the common line 12D.

Note that the structure in FIGS. 2F and 2G can be formed by other processes and is not limited to by the lithography process utilizing the multi-tone photomask. Alternatively, the structure in FIGS. 2F and 2G can be formed by multi lithography steps with a plurality of photomasks.

Figure 3A:
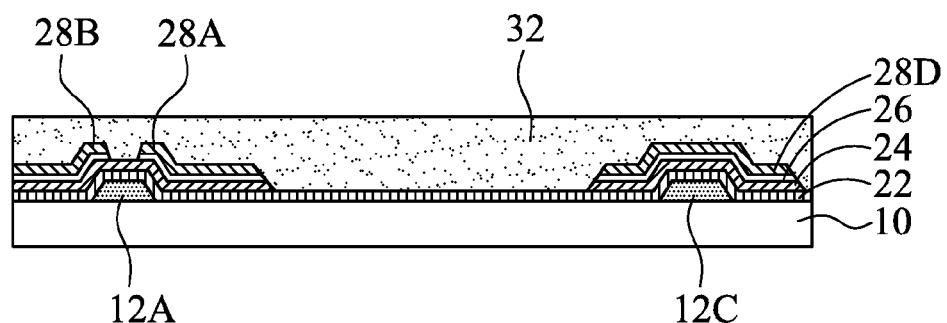

As shown in FIG. 3A, a passivation layer 32 can be blanketly formed on the structure in FIG. 2F. The passivation layer 32 includes silicon nitride, silicon oxide, silicon oxynitride, silicon carbide, or a multi-layered structure thereof. The passivation layer 32 can be formed by a CVD or a PECVD process.

Figure 3B:
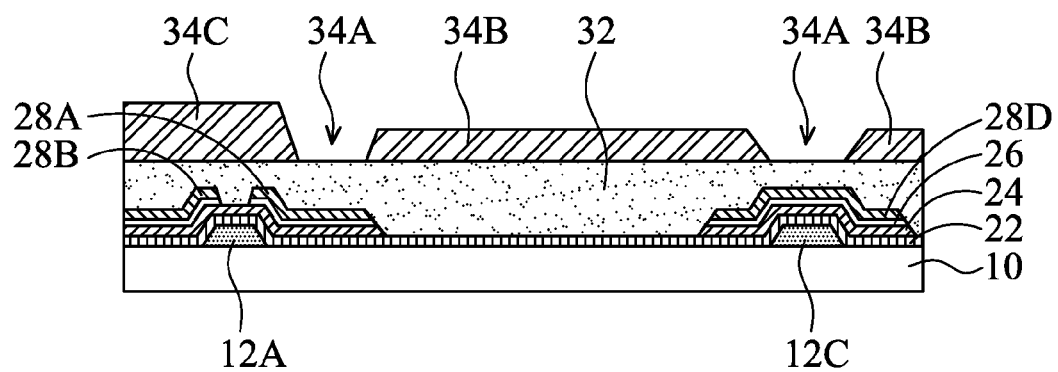
Figure 3C:
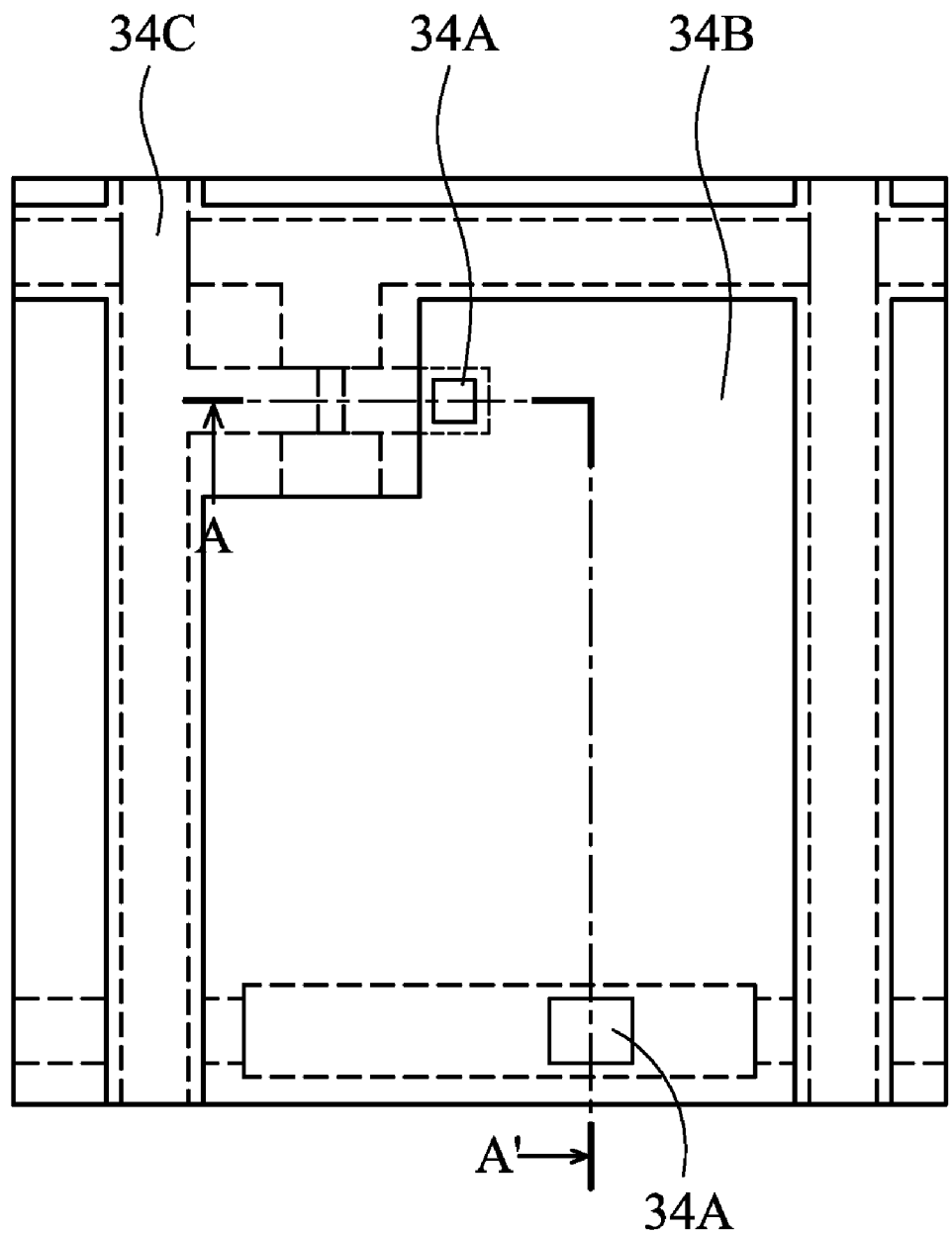

As shown in FIG. 3B, a patterned photoresist layer is formed on the passivation layer 32. The patterned photoresist layer is classified to three regions depending on their thicknesses: a non-photoresist region 34A, a thin photoresist pattern 34B, and a thick photoresist pattern 34C. The non-photoresist region 34A substantially corresponds to a part of the drain electrode 28A of the thin film transistor 200 and a part of the storage capacitor 220, the thin photoresist pattern 34B substantially corresponds to the pixel region 210, and the thick photoresist pattern 34C substantially corresponds to the thin film transistor 200, except for the part of the drain electrode 28A. A multi-tone photomask such as a stack layer photomask or a grey level photomask is utilized to form the non-photoresist region 34A, the thin photoresist pattern 34B, and the thick photoresist pattern 34C with different thicknesses. The composition, formation, and corresponding photomask pattern (transparent region, semi-transparent region, and light-shielding region) of the patterned photoresist layer is similar to the above mentioned patterned photoresist pattern and omitted here. It should be understood that a cross-sectional view of a cross-section line A-A' in FIG. 3C is shown in FIG. 3B. As shown in FIG. 3C, the thick photoresist pattern 34C not only corresponds to the thin film transistor 200A, except for the part of the drain electrode 28A, but also corresponds to the gate electrode liner 12B and the data line 28C. In other words, the thick photoresist pattern 34C corresponds to an outside region of a predetermined pixel electrode layer.

Figure 4A:
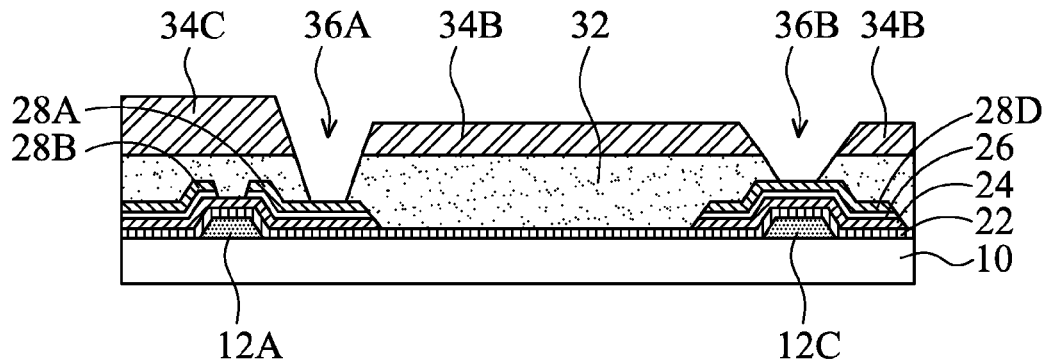

As shown in FIG. 4A, the passivation layer 32 not covered by the patterned photoresist layer is then removed to form contact holes 36A and 36B. A part of the drain electrode 28A is exposed by the contact hole 36A, and a part of the top electrode 28D of the storage capacitor 220 is exposed by the contact hole 36B, respectively. The passivation layer 32 can be removed by a dry etching or wet etching process.

Figure 4B:
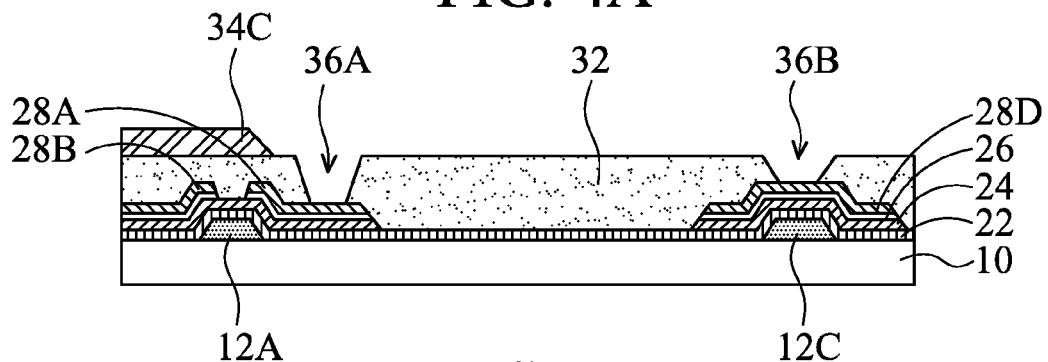

As shown in FIG. 4B, part of the patterned photoresist layer is ashed to expose the passivation layer 32 of the pixel region 210. This ashing step is similar to the above mentioned ashing step and therefore omitted here. The ashing step can totally remove the thin photoresist pattern 34B, and partially remove the thick photoresist pattern 34C. Because the ashing step is an isotropic removal process, the thick photoresist pattern 34C preferably has a larger profile (or area) than its corresponding region, e.g. the thin film transistor 200, except for the part of the drain electrode 28A, the gate line 12B, and the data line 28C. For example, when the thin photoresist pattern 34B has a thickness of 10 μm, the thick photoresist pattern 34C has a first profile edge, and the thin film transistor 200, except for the part of the drain electrode 28A, the gate line 12B, and the data line 28C, have a second profile edge, wherein the first and second profile edges have a distance of 10 μm. As such, the ashing step will not make the thin film transistor 200, except for the part of the drain electrode 28A, the gate line 12B, and the data line 28C, shrink.

Figure 4C:
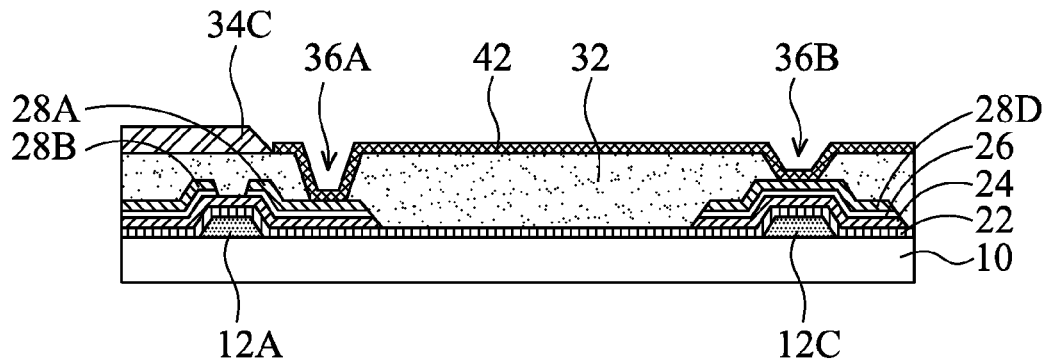

As shown in FIG. 4C, the conductive layer 42 is then selectively deposited on the passivation layer 32 of the pixel region 210, and on the sidewalls and bottoms of the contact holes 36A and 36B. In other words, the selective layer 42 is formed on an outside region of the ashed thick photoresist pattern 34C. The conductive layer 42 serves as a pixel electrode of the pixel region, connects to the drain electrode 28A of the thin film transistor 200 through the contact hole 36A, and contacts the top electrode 28D of the storage capacitor 220 through the contact hole 36B. In one embodiment, the array substrate is applied to a transmissive liquid crystal display, and the conductive layer 42 includes a transparent material such as indium tin oxide (ITO), indium zinc oxide (IZO), aluminum zinc oxide (AZO), cadmium tin oxide (CTO), tin oxide ($SnO_2$), zinc oxide (ZnO), silver nanowire, or carbon nanotube (CNT). In another embodiment, the array substrate is applied to a reflective liquid crystal display, and the conductive layer 42 includes a reflective material such as aluminum, gold, tin, silver, copper, iron, lead, chromium, tungsten, molybdenum, neodymium, nitrides thereof, oxides thereof, oxynitrides thereof, alloys thereof, or combinations thereof. In addition, the conductive layer 42 of a reflective type may have an uneven surface to increase the reflection and scattering effect of the light.

In one embodiment, selective depositing of the conductive layer 42 is performed by atomic layered deposition (ALD) at a temperature of room temperature to 200° C. An overly high depositing temperature may char the photoresist layer, which would make it difficult for removal in later processes. An overly low depositing temperature may slow down the depositing rate, and therefore increase its process period.

Figure 4D:
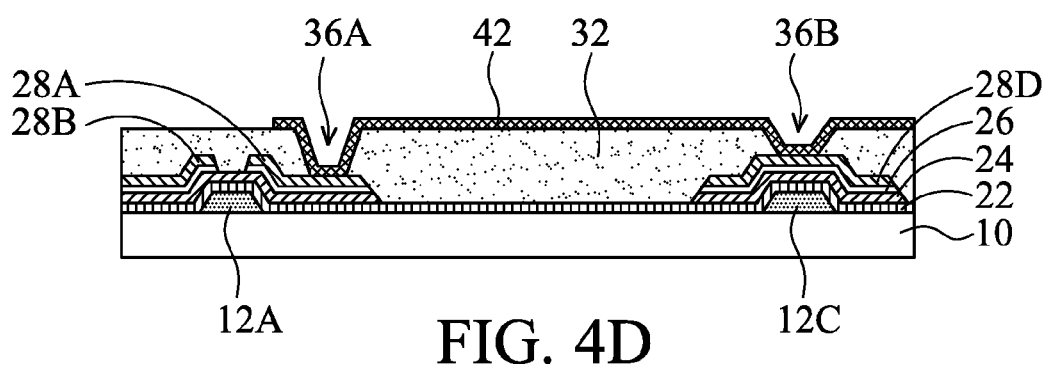
Figure 4E:
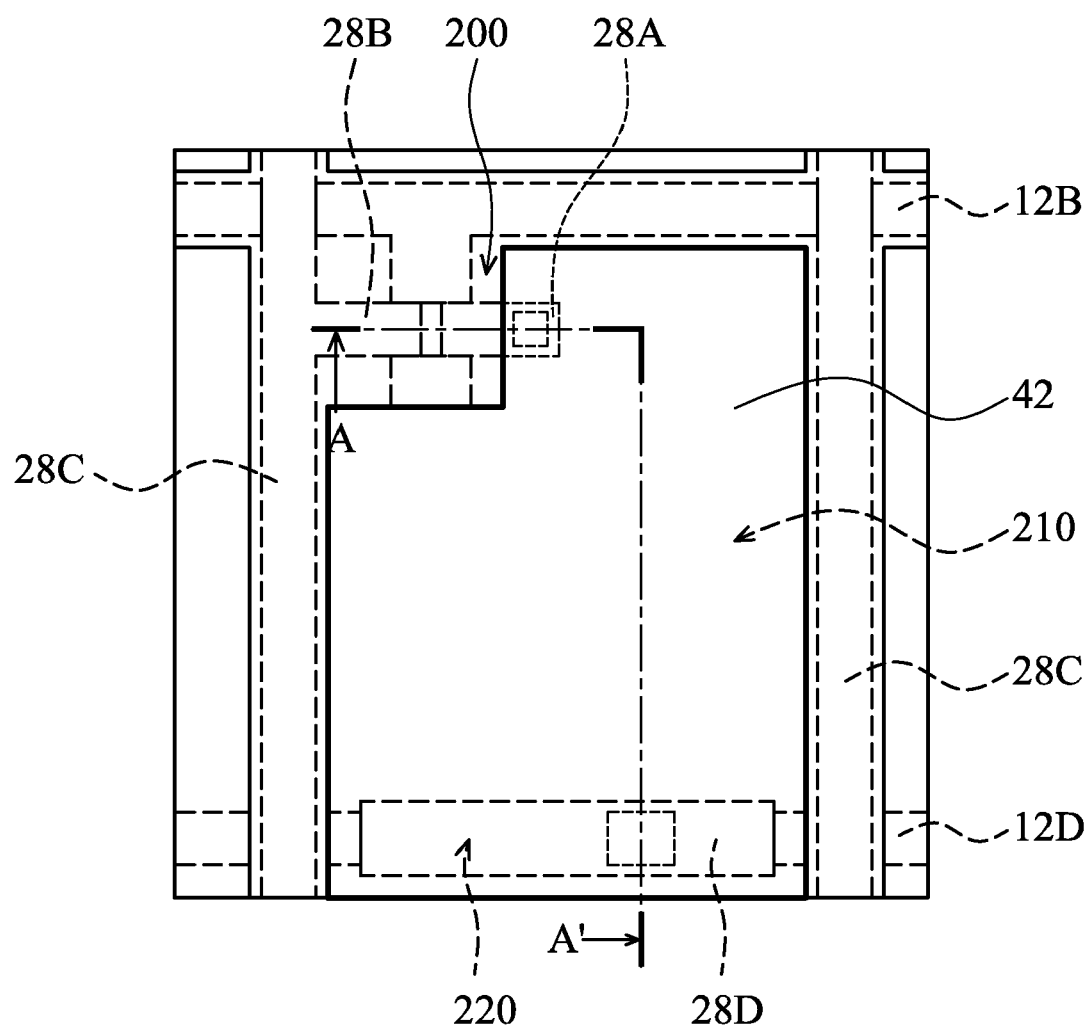

As shown in FIG. 4D, the remaining photoresist layer such as the thick photoresist pattern 34C is removed by the above mentioned ashing step or a conventional wet stripping step, to complete formation of an array substrate. It should be understood that a cross-sectional view of a cross-section line A-A' in FIG. 4E is shown in FIG. 4D.

Compared to related prior arts, by utilizing the multi-tone photomask to define the pixel electrode, lithography process steps may be eliminated and alignment problems may be solved. Furthermore, the conductive layer is formed by selective deposition, such that no conductive layer is required to be formed on the patterned photoresist layer. As a result, following steps just remove the photoresist. The particles of the conductive layer will not remain on the array substrate and reduce product yield after an ashing step, or be suspended in the stripper to obstruct a stripper pipe after a wet stripping step. As described above, three photomasks collocated with selectively depositing the conductive layer 42, may enhance mass production considerations for the array substrate.

Compared to related prior arts, the conductive layer 42 has an excellent surface coverage properties and a smooth round appearance at corners, e.g. the crossover points between the top surface of the passivation layer and the sidewall of the contact hole. The pixel electrode layer formed by a general process (e.g. PVD) has an obvious angle (not round) at same corners. In related prior arts, general processes forms a conductive layer on a photoresist layer and other regions, and then simultaneously removes the photoresist layer and the conductive layer thereon by a lift off process. Thereafter, an edge of the remaining conductive layer may crack or have a sharp top angle, such that a subsequent PI rubbing process may cause scrubbing damage or particles remained on the substrate. Compared to the related prior arts, the disclosure eliminates requirement of the lift off process, and the conductive layer 42 has a smooth appearance at edges and corners thereof.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A method for manufacturing an array substrate, comprising:
    forming a thin film transistor, a pixel region, and a storage capacitor on a substrate, respectively;

forming a passivation layer on the thin film transistor, the pixel region, and the storage capacitor;

forming a first photoresist layer on the passivation layer;

performing a lithography process by a first multi-tone photomask to pattern the first photoresist layer, thereby forming a first non-photoresist region, a first thin photoresist pattern, and a first thick photoresist pattern, wherein the first non-photoresist region substantially corresponds to a part of a drain electrode of the thin film transistor and a part of the storage capacitor, the first thin photoresist pattern substantially corresponds to the pixel region, and the first thick photoresist pattern substantially corresponds to the thin film transistor except for the part of the drain electrode;

removing the passivation layer of the first non-photoresist region to expose the part of the drain electrode of the thin film transistor and the part of the storage capacitor;

ashing the first thin photoresist pattern to expose the passivation layer of the pixel region;

selectively depositing a conductive layer on the exposed part of the drain electrode of the thin film transistor, the exposed part of the storage capacitor, and the exposed part of the passivation layer; and removing the first thick photoresist pattern.

2. The method as claimed in claim 1, wherein the step of selectively depositing the conductive layer is performed at a temperature of room temperature to 200° C.

3. The method as claimed in claim 1, wherein the step of selectively depositing the conductive layer is performed by atomic layered deposition.

4. The method as claimed in claim 1, wherein the first multi-tone photomask comprises a stack layer photomask or a grey level photomask.

5. The method as claimed in claim 1, wherein the first thin photoresist pattern has a larger area than the pixel region.

6. The method as claimed in claim 1, wherein the first thick photoresist pattern has a larger area than the thin film transistor except for the part of the drain electrode.

7. The method as claimed in claim 1, wherein the step of forming the thin film transistor, the pixel region, and the storage capacitor on the substrate, respectively, comprises:

forming a first conductive pattern on the substrate, wherein the first conductive pattern comprises a gate electrode of the thin film transistor, a gate line connected to the gate electrode, and a common electrode line;

sequentially forming a gate insulation layer, a semiconductor layer, an ohmic contact layer, and a second conductive layer on the first conductive pattern and the substrate;

forming a second photoresist layer on the second conductive layer;

performing a lithography process by a second multi-tone photomask to pattern the second photoresist layer, thereby forming a second non-photoresist region, a second thin photoresist pattern, and a second thick photoresist pattern, wherein the second non-photoresist region substantially corresponds to the pixel region, the second thin photoresist pattern substantially corresponds to a channel region of the thin film transistor, and the second thick photoresist pattern substantially corresponds to the storage capacitor and a source electrode and the drain electrode of the thin film transistor;

removing the second conductive layer of the second non-photoresist region to expose the ohmic contact layer of the pixel region;

ashing the second thin photoresist pattern to expose the channel region of the thin film transistor; and removing the second conductive layer and the ohmic contact layer corresponding to the second thin photoresist pattern, and the exposed part of the ohmic contact layer and the semiconductor layer thereunder of the pixel region; and removing the second thick photoresist layer.

8. The method as claimed in claim 7, wherein the second multi-tone photomask comprises a stack layer photomask or a grey level photomask.

9. The method as claimed in claim 7, wherein the second thin photoresist pattern has a larger area than the channel region of the thin film transistor.

10. The method as claimed in claim 7, wherein the second thick photoresist pattern has a larger area than the storage capacitor and the source electrode and the drain electrode of the thin film transistor.

* * * * *